United States Patent [19]
Yamaguchi

[11] Patent Number: 6,081,029
[45] Date of Patent: Jun. 27, 2000

[54] RESIN ENCAPSULATED SEMICONDUCTOR DEVICE HAVING A REDUCED THICKNESS AND IMPROVED RELIABILITY

[75] Inventor: Yukio Yamaguchi, Shiga, Japan

[73] Assignee: Matsushita Electronics Corporation, Osaka, Japan

[21] Appl. No.: 09/244,074

[22] Filed: Feb. 4, 1999

[30] Foreign Application Priority Data

Mar. 12, 1998 [JP] Japan ................................. 10-060811

[51] Int. Cl.[7] ........................ H01L 23/50; H01L 23/495; H01L 23/28; H01L 23/36
[52] U.S. Cl. ...................... 257/718; 257/666; 257/696; 257/698; 257/684; 257/797; 257/675; 257/692
[58] Field of Search ................................. 257/666, 684, 257/690, 692, 293, 698, 696, 712, 713, 717, 720, 797, 675, 718

[56] References Cited

U.S. PATENT DOCUMENTS

| | | | |
|---|---|---|---|
| 5,105,259 | 4/1992 | McShane et al. | 257/667 |
| 5,157,480 | 10/1992 | McShane et al. | 361/424 |
| 5,172,214 | 12/1992 | Casto | 257/676 |
| 5,225,897 | 7/1993 | Reifel et al. | 257/787 |
| 5,381,042 | 1/1995 | Lerner et al. | 257/712 |
| 5,521,429 | 5/1996 | Aono et al. | 257/676 |
| 5,641,987 | 6/1997 | Lee | 257/675 |
| 5,652,461 | 7/1997 | Ootsuki et al. | 257/675 |
| 5,731,632 | 3/1998 | Kozono | 257/717 |
| 5,835,988 | 11/1998 | Ishii | 257/684 |
| 5,872,395 | 2/1999 | Fujimoto | 257/675 |
| 5,900,676 | 5/1999 | Kweon et al. | 257/787 |

*Primary Examiner*—Alexander O. Williams
*Attorney, Agent, or Firm*—McDermott, Will & Emery

[57] ABSTRACT

A lead frame including signal-connecting leads, a die pad and support leads is provided. A semiconductor chip is bonded to the die pad with an adhesive. The semiconductor chip, electrode pads and the signal-connecting leads are electrically connected to each other with metal fine wires. And these members are encapsulated in a resin encapsulant. The back surface of the die pad is subjected to half etching or the like to form a convex portion and a flange portion surrounding the convex portion. Since a thin layer of the resin encapsulant exists under the flange portion, the resin encapsulant can hold the die pad more strongly and the moisture resistance of the device can be improved with the lower surface of the die pad protruding from the resin encapsulant. As a result, the characteristics of a resin-molded semiconductor device having a die pad exposed on the back surface of a resin encapsulant can be improved.

8 Claims, 15 Drawing Sheets

RESIN ENCAPSULATED SEMICONDUCTOR DEVICE HAVING A REDUCED THICKNESS AND IMPROVED RELIABILITY

BACKGROUND OF THE INVENTION

The present invention relates to a resin-molded semiconductor device in which a semiconductor chip and signal-connecting leads to be connected to the chip are encapsulated with a resin encapsulant, a method for manufacturing such a device, and a lead frame suitable for manufacturing the resin-molded semiconductor device. In particular, the present invention relates to an improved device with a reduced thickness.

In recent years, in order to catch up with rapidly advancing downsizing of electronic appliances, it has become increasingly necessary to mount semiconductor components with higher and higher density. Correspondingly, sizes and thicknesses of semiconductor components have also been noticeably reduced.

Hereinafter, a conventional resin-molded semiconductor device will be described.

FIG. 20 is a cross-sectional view of a conventional resin-molded semiconductor device. As shown in FIG. 20, this semiconductor device includes external electrodes on its back surface.

The semiconductor device further includes a lead frame consisting of: inner leads 101; a die pad 102; and support leads (not shown) for supporting the die pad 102. A semiconductor chip 104 is bonded onto the die pad 102 with an adhesive, and electrode pads (not shown) of the chip 104 are electrically connected to the inner leads 101 with metal fine wires 105. And the die pad 102, semiconductor chip 104, part of the inner leads 101, support leads and metal fine wires 105 are encapsulated with a resin encapsulant 106. In this structure, no resin encapsulant 106 exists on the back surface of the inner leads 101. In other words, the respective back surfaces of the inner leads 101 are exposed and the respective lower parts of the inner leads 101, including the exposed back surfaces thereof, are used as external electrodes 107. To improve the adhesion between the resin encapsulant 106 and the inner leads 101 or the die pad 102, the side faces of the leads 101 and the pad 102 are formed like a taper with an upwardly increasing thickness, not to extend perpendicularly to their upper and lower surfaces.

In such a resin-molded semiconductor device, the respective back surfaces of the resin encapsulant 106 and the die pad 102 are both located on the same plane. Stated otherwise, the back surface of the lead frame is not substantially encapsulated. Accordingly, the thickness of such a semiconductor device is thinner than usual.

A resin-molded semiconductor device having such a structure as that shown in FIG. 20 is manufactured in the following manner. First, a lead frame including inner leads 101 and a die pad 102 is prepared and then wrought mechanically or chemically to shape the side faces of the lead frame like a taper. Next, a semiconductor chip 104 is bonded onto the die pad 102 of the lead frame prepared, and is electrically connected to the inner leads 101 with metal fine wires 105. As the metal fine wires 105, aluminum (Al) or gold (Au) wires may be appropriately used, for example. Then, the die pad 102, semiconductor chip 104, inner leads 101, support leads and metal fine wires 105 are encapsulated with a resin encapsulant 106. In this case, the lead frame, on which the semiconductor chip 104 has been bonded, is introduced into a die assembly and transfer-molded. In particular, resin molding is performed with the back surface of the lead frame in contact with an upper or lower die of the die assembly. Finally, parts of outer leads, protruding outward from the resin encapsulant 106, are cut off, thereby completing a resin-molded semiconductor device.

Although a conventional resin-molded semiconductor device of this type has a reduced thickness, the device has the following problems.

Firstly, a resin encapsulant covers the upper and side faces of a die pad, but does not exist on the back surface thereof. Accordingly, the resin encapsulant cannot hold the die pad and the semiconductor chip so strong as that of other thicker devices, resulting in deterioration in reliability of the device.

Secondly, stress applied by the resin encapsulant or stress applied after assembling might have unwanted effects on a semiconductor chip or the resin encapsulant might possibly crack. Particularly when moisture penetrates between the die pad and the resin encapsulant, the adhesion therebetween decreases to a noticeable degree or considerable cracking is created. As a result, the reliability of the device further deteriorates.

Thirdly, although a resin-molded semiconductor device can be generally mounted accurately on a motherboard to be self-aligned with its desired position using the tension of solder, the time taken to settle the self alignment is still to be shortened and the mounting accuracy is still to be improved.

Fourthly, if part of a resin encapsulant sticks out of the back surface of a die pad in bonding the die pad and a motherboard (i.e., if so-called resin burr exists), then desired characteristics might not be attained in terms of heat radiation, for example. This is because the die pad cannot be in satisfactory contact with a heat-radiating pad in such a case. Such resin burr can be removed by using water jet or the like. However, such a process is not just troublesome, but causes additional problems. Specifically, if a water jet process is carried out, then a nickel, palladium or gold plated layer might peel off and impurity might deposit on the exposed parts. Accordingly, such parts exposed on the resin encapsulant should be plated once again after the encapsulation. As a result, work efficiency and reliability of the device might possibly deteriorate.

SUMMARY OF THE INVENTION

A first object of this invention is providing a resin-molded semiconductor device suppressing delamination of a die pad by making a resin encapsulant hold the pad more strongly when the lower surface of the pad is exposed on the encapsulant, and a lead frame suitable for manufacturing such a device.

A second object is providing a resin-molded semiconductor device, preventing a resin encapsulant from cracking due to penetration of water or moisture between a die pad and the encapsulant, and a lead frame suitable for manufacturing such a device.

A third object is providing a resin-molded semiconductor device that can be self-aligned with a desired position on a motherboard more accurately by using a structure where the lower surface of a die pad is exposed on the resin encapsulant, and a method for manufacturing the same.

A fourth object is providing a resin-molded semiconductor device with heat radiation characteristics improved by preventing the formation of resin burr even if the lower surface of a die pad is exposed on the encapsulant, a manufacturing method thereof, and a lead frame suitable for manufacturing such a device.

A fifth object is providing a resin-molded semiconductor device in which solder balls need not be interposed between a die pad and a heat-radiating pad, and a method for manufacturing the same.

A first lead frame according to the present invention includes: an outer frame surrounding a region in which a semiconductor chip is mounted; a die pad formed in the region surrounded by the outer frame; a support portion for supporting the die pad by connecting the die pad to the outer frame; and signal-connecting leads connected to the outer frame. A convex portion protruding downward and a flange portion surrounding the convex portion are formed as lower part of the die pad.

In this structure, even if the lower surface of the convex portion of the die pad is not covered with the resin encapsulant in mounting a semiconductor chip on this lead frame and encapsulating the chip and the lead frame with a resin encapsulant, the encapsulant exists under the flange portion of the die pad. As a result, a resin-molded semiconductor device, where a resin encapsulant can hold the die pad more strongly, is obtained. That is to say, the first object is accomplished. In addition, since the adhesion between the resin encapsulant and the die pad increases in such a structure, penetration of water or moisture through the boundary between the resin encapsulant and the die pad can be suppressed. Consequently, the second object, or increase in moisture resistance, is also achieved.

A second lead frame according to the present invention includes: an outer frame surrounding a region in which a semiconductor chip is mounted; a die pad formed in the region surrounded by the outer frame; a support portion for supporting the die pad by connecting the die pad to the outer frame; and signal-connecting leads connected to the outer frame. The die pad is provided with a hole.

In this structure, when a semiconductor chip is mounted onto this lead frame and the lead frame and chip are encapsulated with a resin encapsulant, the encapsulant also exists inside the hole, thus increasing the force of the encapsulant holding the die pad. Accordingly, the first and second objects are accomplished.

In one embodiment of the present invention, the hole of the die pad has a stepped shape, the lower part of the hole being wider in diameter than the upper part thereof.

In such an embodiment, not only the resin encapsulant can hold the die pad even more strongly, but also the moisture resistance of the device can be remarkably increased.

A third lead frame according to the present invention includes: an outer frame surrounding a region in which a semiconductor chip is mounted; a die pad formed in the region surrounded by the outer frame; support leads for supporting the die pad by connecting the die pad to the outer frame; and signal-connecting leads connected to the outer frame. The die pad is located below the outer frame.

In this structure, when a semiconductor chip is mounted onto this lead frame and the chip and the lead frame are encapsulated with a resin encapsulant, clamping force, applied through a die assembly onto the outer frame, is efficiently applied to the die pad. Thus, if encapsulation is performed with a seal tape adhered to the lower surface of the lead frame, then the die pad is advantageously forced into the seal tape. Accordingly, this lead frame is suitable for protruding the die pad downward from the back surface of the resin encapsulant. In other words, since a standoff height is secured, solder balls or the like no longer need to be interposed between the die pad and a motherboard. As a result, the fifth object is accomplished.

In one embodiment of the present invention, part of each said support lead is bent to function as a spring.

In such an embodiment, since each support lead is deformed at its bent portion, deformation of the die pad due to pressure can be suppressed.

A fourth lead frame according to the present invention includes: an outer frame surrounding a region in which a semiconductor chip is mounted; a die pad formed in the region surrounded by the outer frame; support leads for supporting the die pad by connecting the die pad to the outer frame; and signal-connecting leads connected to the outer frame. The die pad is located below the outer frame, and the support leads are provided between the signal-connecting leads and the die pad.

In this structure, when a semiconductor chip is mounted onto this lead frame and the chip and the lead frame are encapsulated with a resin encapsulant, clamping force, applied through a die assembly onto the outer frame, can be transmitted to the die pad even more efficiently. Thus, the same effects as those of the third lead frame can be attained.

In one embodiment of the present invention, part of each said support lead is bent to function as a spring, and the thickness of the bent part of each said support lead is reduced at the bottom thereof.

In such an embodiment, after a semiconductor chip has been mounted onto this lead frame and the chip and the lead frame have been encapsulated with a resin encapsulant, the signal-connecting leads connected to the support leads can be cut off more easily.

A first resin-molded semiconductor device according to the present invention includes: a semiconductor chip having electrode pads; a die pad for supporting the semiconductor chip thereon; signal-connecting leads; connecting members for electrically connecting the electrode pads of the semiconductor chip to the signal-connecting leads; and a resin encapsulant for encapsulating the die pad, the semiconductor chip, the signal-connecting leads and the connecting members. A convex portion protruding downward and a flange portion surrounding the convex portion are formed as lower part of the die pad. And at least lower part of the convex portion of the die pad is not covered with the resin encapsulant but exposed, whereas the flange portion of the die pad is buried in the resin encapsulant.

In this structure, the resin encapsulant exists under the flange portion of the die pad. Accordingly, the resin encapsulant can hold the die pad more strongly and the first object is accomplished. In addition, since penetration of water or moisture through the back surface of the resin-molded semiconductor device can also be advantageously suppressed as described above, the second object is achieved as well.

A second resin-molded semiconductor device according to the present invention includes: a semiconductor chip having electrode pads; a die pad for supporting the semiconductor chip thereon; signal-connecting leads; connecting members for electrically connecting the electrode pads of the semiconductor chip to the signal-connecting leads; and a resin encapsulant for encapsulating the die pad, the semiconductor chip, the signal-connecting leads and the connecting members. Lower part of the die pad is at least partially not covered with the resin encapsulant but exposed, and the die pad is provided with a hole.

In this structure, since the resin encapsulant exists inside the hole of the die pad, the resin encapsulant can hold the die pad even more strongly. As a result, the first and second objects are accomplished.

In one embodiment of the present invention, lower part of the die pad protrudes at least partially from the resin encapsulant.

In such an embodiment, the resin-molded semiconductor device is obtained by encapsulating the chip and the lead frame, with a seal tape adhered to the lower surface of the die pad, which is forced into the seal tape. Accordingly, in this structure, no resin encapsulant sticks out of the hole on the lower surface of the die pad. As a result, a resin-molded semiconductor device excellent in heat radiating characteristics, where no resin burr exists on the lower surface of the die pad thereof, can be obtained.

A third resin-molded semiconductor device according to the present invention includes: a semiconductor chip having electrode pads; a die pad for supporting the semiconductor chip thereon; signal-connecting leads; connecting members for electrically connecting the electrode pads of the semiconductor chip to the signal-connecting leads; and a resin encapsulant for encapsulating the die pad, the semiconductor chip, the signal-connecting leads and the connecting members. Respective lower parts of the die pad and the signal-connecting leads are at least partially not covered with the resin encapsulant but exposed. And the lower surface of the exposed part of the die pad is located at a level different from that of the lower surface of the exposed part of the signal-connecting leads.

When such a resin-molded semiconductor device is mounted onto a motherboard, the gap between the die pad and the motherboard is different in height from the gap between the signal-connecting leads and the motherboard. Accordingly, since the tension of solder interposed therebetween also differs between these two points, the device can be self-aligned more accurately and rapidly. That is to say, the time taken to realize good self-alignment can be shortened and the positional accuracy can also be improved.

In one embodiment of the present invention, the lower surface of the exposed part of the die pad is preferably located at a level lower than the lower surface of the exposed part of the signal-connecting leads.

In such a case, the level difference between the lower surfaces of the respective exposed parts of the die pad and the signal-connecting leads is preferably in the range from 10 $\mu$m to 150 $\mu$m.

In another embodiment, the respective lower parts of the die pad and the signal-connecting leads preferably both protrude at least partially from the resin encapsulant.

A fourth resin-molded semiconductor device according to the present invention includes: a semiconductor chip having electrode pads; a die pad for supporting the semiconductor chip thereon; support leads for supporting the die pad; signal-connecting leads; connecting members for electrically connecting the electrode pads of the semiconductor chip to the signal-connecting leads; and a resin encapsulant for encapsulating the die pad, the semiconductor chip, the signal-connecting leads and the connecting members. Respective lower parts of the die pad and the signal-connecting leads are at least partially not covered with the resin encapsulant but exposed. And each said support lead extends from an associated corner of the die pad to reach a side face of the resin encapsulant and is partially bent to function as a spring.

In this structure, during encapsulation using a lead frame where a die pad is located below an outer frame, clamping force, applied through a die assembly to the outer frame, can be transmitted to the die pad, while making the bent portions suppress the deformation of support leads. Thus, if encapsulation is performed with a seal tape adhered to the lower surface of the lead frame, then the die pad is forced into the seal tape. Accordingly, a structure in which the die pad protrudes downward from the back surface of the resin encapsulant can be obtained with more certainty. In addition, deformation of the die pad can be suppressed. As a result, the fifth object is accomplished while keeping the shape of the resin-molded semiconductor device good enough.

A fifth resin-molded semiconductor device according to the present invention includes: a semiconductor chip having electrode pads; a die pad for supporting the semiconductor chip thereon; support leads for supporting the die pad; signal-connecting leads; connecting members for electrically connecting the electrode pads of the semiconductor chip to the signal-connecting leads; and a resin encapsulant for encapsulating the die pad, the semiconductor chip, the signal-connecting leads and the connecting members. Respective lower parts of the die pad and the signal-connecting leads are at least partially not covered with the resin encapsulant but exposed. And the support leads are provided between the die pad and the signal-connecting leads.

When the chip and the lead frame are encapsulated with a resin encapsulant during the manufacturing process of the resin-molded semiconductor device having such a structure, clamping force, applied through a die assembly to the outer frame, can be transmitted to the die pad with more certainty. Accordingly, the same effects as those of the fourth resin-molded semiconductor device can be attained.

In one embodiment of the present invention, each said support lead is partially bent to function as a spring, and is partially cut off.

In such an embodiment, the signal-connecting leads, which was connected to the support leads, can be used for signal connection irrespective of the type of the semiconductor chip.

In another embodiment, a portion surrounding the cut part of each said support lead is thinner than the other parts of the support lead.

In such an embodiment, the support leads can be cut off more easily.

In still another embodiment, the lower surface of the exposed part of the die pad is preferably located at a level lower than the lower surface of the exposed part of the signal-connecting leads.

In the first to fifth resin-molded semiconductor devices, a groove portion is preferably formed in at least part of the signal-connecting leads.

In such a structure, even if the lower surface of the signal-connecting leads is not covered with the resin encapsulant but exposed, the resin encapsulant can hold the signal-connecting leads strongly enough.

A first method for manufacturing a resin-molded semiconductor device according to the present invention includes the steps of: a) preparing a lead frame, the lead frame including: an outer frame surrounding a region in which a semiconductor chip is mounted; a die pad for supporting the semiconductor chip thereon; support leads for connecting the die pad to the outer frame; and signal-connecting leads to be connected to the outer frame, the die pad being located below the signal-connecting leads; b) mounting the semiconductor chip, including electrode pads, onto the die pad; c) electrically connecting the electrode pads of the semiconductor chip to the signal-connecting leads with metal fine wires; d) attaching a seal tape to a die assembly while adhering the seal tape at least partially to the respective lower surfaces of the die pad and the signal-connecting leads of the lead frame; encapsulating the die pad, the semiconductor chip, the signal-connecting leads and the metal fine wires with a resin encapsulant; and f) removing the seal tape. The respective lower surfaces of the die pad and the signal-connecting leads are at least partially not covered with the back surface of the resin encapsulant but exposed. And the lower surface of the exposed part of the die pad is located at a level lower than the lower surface of the exposed part of the signal-connecting leads.

When a resin-molded semiconductor device is mounted onto a motherboard in accordance with this method, the large tension of solder or the like under the die pad regulates the self alignment of the device in terms of the position defined and the time taken. Accordingly, the device can be mounted at a desired position in a shorter time and with higher accuracy. That is to say, the third object is accomplished.

A second method for manufacturing a resin-molded semiconductor device according to the present invention includes the steps of: a) preparing a lead frame, the lead frame including: an outer frame surrounding a region in which a semiconIs ductor chip is mounted; a die pad for supporting the semiconductor chip thereon; signal-connecting leads to be connected to the outer frame; and support leads interposed between the die pad and the signal-connecting leads; b) mounting the semiconductor chip, including electrode pads, onto the die pad; c) electrically connecting the electrode pads of the semiconductor chip to the signal-connecting leads with metal fine wires; d) attaching a seal tape to a die assembly while adhering the seal tape at least partially to the respective lower surfaces of the die pad and the signal-connecting leads of the lead frame; e) encapsulating the die pad, the semiconductor chip, the signal-connecting leads and the metal fine wires with a resin encapsulant; f) cutting off part of each said support lead; and g) removing the seal tape. The respective lower surfaces of the die pad and the signal-connecting leads are at least partially not covered with the back surface of the resin encapsulant but exposed.

In accordance with this method, clamping force, applied onto the outer frame of the lead frame, can be efficiently transmitted to the die pad through the support leads in the step e). Thus, a structure in which the die pad protrudes from the resin encapsulant can be obtained with more certainty. In addition, since the signal-connecting leads, which were connected to the support leads, are cut off from the die pad in the step f), the signal-connecting leads can be used for signal connection irrespective of the type of the semiconductor chip mounted. That is to say, the fifth object is accomplished.

In one embodiment of the first or second method according to the present invention, a metal plated layer may be formed on the surface of the lead frame in the step a).

In such an embodiment, plating work can be simplified as compared with a method in which only parts exposed out of a resin encapsulant are plated after the encapsulation. In addition, since the lead frame buried in the resin encapsulant is also plated, the reliability of the resin-molded semiconductor device improves.

In another embodiment of the first or second method, the thickness of the seal tape is adjusted in the step d) at a predetermined value such that at least part of the respective lower surfaces of the die pad and the signal-connecting leads protrude from the back surface of the resin encapsulant to reach respective desired heights.

In such an embodiment, the height of the part of the die pad protruding from the resin encapsulant can be adjusted at a desired value.

In still another embodiment of the first or second method, clearance grooves are formed in respective regions of the die assembly to make protruding portions of the die pad and the signal-connecting leads enter the grooves. And in the step e), encapsulation is performed while making at least part of the respective lower surfaces of the die pad and the signal-connecting leads enter the clearance grooves, thereby adjusting the respective heights of the portions protruding from the back surface of the resin encapsulant.

A third method for manufacturing a resin-molded semiconductor device according to the present invention includes the steps of: a) preparing a die assembly having a suction hole, a semiconductor chip and a peripheral member for the semiconductor chip; b) attaching a seal tape to between the peripheral member and the die assembly such that the seal tape adheres to part of a surface of the peripheral member; c) forming a hole in part of the seal tape adhered to the peripheral member; d) sucking part of the peripheral member through the suction hole of the die assembly and the hole of the tape; e) encapsulating the semiconductor chip and the peripheral member except for the part of the surface thereof in a resin encapsulant, with the seal tape adhered to the surface, and f) removing the seal tape after the step e) has been performed. After the step d) is finished, at least part of the surface of the peripheral member protrudes and is not covered with the resin encapsulant but exposed.

In accordance with this method, part of the peripheral member is forced into the seal tape as the member has been sucked through the suction hole of the die assembly in the step d). Accordingly, a resin-molded semiconductor device, in which part of the peripheral member protrudes from the resin encapsulant after the encapsulation, can be obtained. That is to say, the fifth object is accomplished.

In one embodiment of the present invention, a lead frame having a die pad may be prepared in the step a) as the peripheral member of the semiconductor chip, and the part of the surface of the peripheral member adhered to the tape in the step b) may be the die pad of the lead frame.

A fourth method for manufacturing a resin-molded semiconductor device according to the present invention includes the steps of: a) preparing a die assembly, a semiconductor chip and a peripheral member for the semiconductor chip; b) attaching a seal tape to between the peripheral member and the die assembly such that the seal tape adheres to part of a surface of the peripheral member, the thickness of the seal tape being in the range from 10 $\mu$m to 150 $\mu$m; c) encapsulating the semiconductor chip and the peripheral member except for at least the part of the surface thereof in a resin encapsulant, with the seal tape adhered to the surface, and d) removing the seal tape after the step c) has been performed. After the step d) is finished, at least part of the surface of the peripheral member protrudes and is not covered with the resin encapsulant but exposed.

In accordance with this method, a resin-molded semiconductor device, in which part of the peripheral member protrudes from the resin encapsulant after the encapsulation, is obtained. That is to say, the fifth object is accomplished.

DESCRIPTION OF THE PREFERRED EMBODIMENTS

The resin-molded semiconductor device of the present invention has a structure in which the lower surface of a die pad is exposed out of the back surface of a resin encapsulant in all of the following embodiments to be described below.

EMBODIMENT 1

Figure 1:
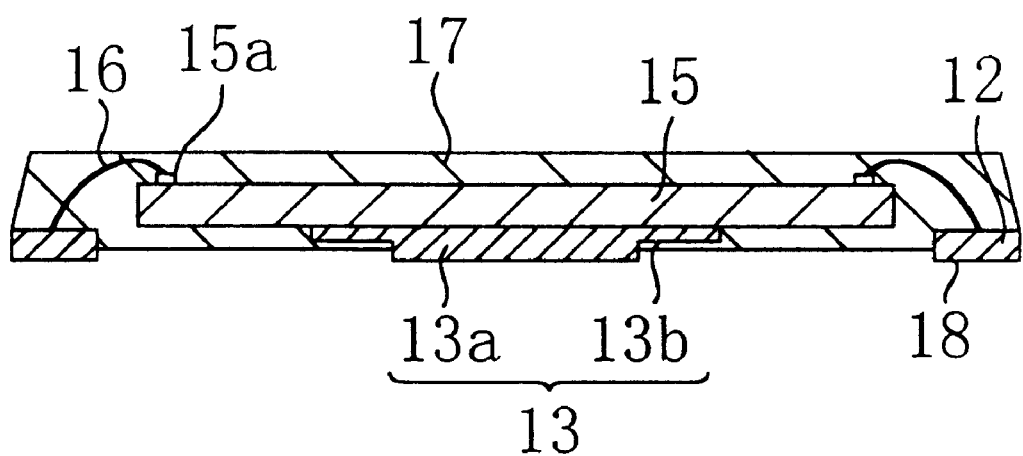
FIG. 1 is a cross-sectional view of a resin-molded semiconductor device according to the first embodiment of the present invention where the resin encapsulant is illustrated as being transparent.

FIG. 1 is a cross-sectional view of a resin-molded semiconductor device according to the first embodiment. In FIG. 1, a resin encapsulant 17 is illustrated as being transparent and support leads are not shown.

As shown in FIG. 1, the resin-molded semiconductor device of this embodiment includes a lead frame consisting of: signal-connecting leads 12; a die pad 13 for supporting a semiconductor chip 15 thereon; and support leads for supporting the die pad 13. The semiconductor chip 15 is bonded on the die pad 13 with an adhesive and electrode pads 15a of the chip 15 are electrically connected to the signal-connecting leads 12 with metal fine wires 16. And the signal-connecting leads 12, die pad 13, support leads, semiconductor chip 15 and metal fine wires 16 are encapsulated within a resin encapsulant 17 like an epoxy resin.

This embodiment is characterized by the shape and position of the lower part of the die pad 13. Specifically, the lower part of the die pad 13 has a stepped structure, which is formed by half etching or the like and includes a convex portion 13 at the center thereof and a flange portion 13b surrounding the convex portion 13a. And only lower part of the convex portion 13a protrudes from the back surface of the resin encapsulant 17. Accordingly, after the chip, frame and so on have been encapsulated with the resin encapsulant 17, a thin layer of the resin encapsulant 17 exists under the flange portion 13b and around the convex portion 13a of the die pad 13.

Also, no resin encapsulant 17 exists on the respective lower parts of the signal-connecting leads 12. In other words, the respective lower surfaces of the signal-connecting leads 12 are exposed, and are used as interconnection with a motherboard. That is to say, the respective lower parts of the signal-connecting leads 12 function as external electrodes 18.

Virtually no resin burr, which ordinarily sticks out during the step of encapsulating, exists on the exposed convex portion 13a of the die pad 13 and on the external electrodes 18. And the convex portion 13a of the die pad 13 and the external electrodes 18 slightly protrude downward from the back surface of the resin encapsulant 17. The convex portion 13a of the die pad 13 and the external electrodes 18 can be easily formed in such a shape as protruding downward by the process described later so as to have no resin burr thereon.

In the resin-molded semiconductor device of this embodiment, the lower part of the die pad 13 has a stepped structure including the convex portion 13a at its center and only lower part of the convex portion 13a is exposed out of the resin encapsulant 17. Accordingly, a thin layer of the resin encapsulant 17 exists under the flange portion 13b of the die pad 13. As a result, the resin encapsulant 17 can hold the die pad 13 more strongly, thus improving the reliability of the resin-molded semiconductor device.

Also, since the holding force increases, the adhesion between the resin encapsulant 17 and the die pad 13 also increases, which prevents the penetration of water or moisture through the boundary therebetween, resulting in increase of moisture resistance of the device. Consequently, the reliability of the resin-molded semiconductor device further improves.

Moreover, no resin burr exists on the lower surface of the exposed convex portion 13a of the die pad 13, thus improving the reliability of bonding between the convex portion 13a and the motherboard and heat radiating characteristics.

In this embodiment, no outer leads, ordinarily functioning as external electrode terminals, exist around the signal-connecting leads 12. Instead, the respective lower parts of the signal-connecting leads 12, corresponding to inner leads, function as external electrodes 18. Accordingly, such a structure contributes to downsizing of a semiconductor device. Moreover, since no resin burr exists on the respective lower surfaces of the signal-connecting leads 12, i.e., the lower surfaces of the external electrodes 18, the electrodes of the motherboard can be bonded to these external electrodes 18 with more reliability. Furthermore, since the external electrodes 18 protrude from the plane of the resin encapsulant 17, a standoff height, which is to be secured for bonding the external electrodes 18 to the electrodes of the motherboard during mounting of a resin-molded semiconductor device, has already been provided for the external electrodes. Accordingly, the external electrodes 18 can be used as external terminals as they are, and there is no need to attach solder balls or the like to the external electrodes 18 during mounting of the device on the motherboard. As a result, number of process steps and manufacturing cost can be advantageously reduced.

Next, a method for manufacturing the resin-molded semiconductor device of this embodiment will be described with reference to the drawings. FIGS. 2 through 6 are cross-sectional views illustrating respective process steps for manufacturing the resin-molded semiconductor device of this embodiment.

Figure 2:
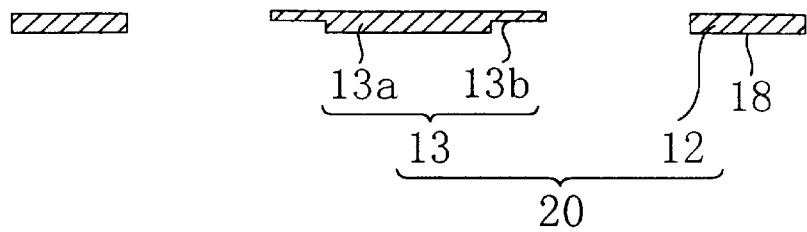
FIG. 2 is a cross-sectional view illustrating the step of preparing a lead frame during the process of manufacturing the resin-molded semiconductor device of the first embodiment.

First, in the process step shown in FIG. 2, a lead frame, including signal-connecting leads 12 and a die pad 13 for supporting a semiconductor chip thereon, is prepared. Although the die pad 13 is actually supported by support leads, the support leads are not illustrated in FIG. 2 because the leads are not included in this cross section. Also, the outer periphery of the signal-connecting leads 12 is connected to an outer frame of the lead frame 20. But the boundary between the signal-connecting leads 12 and the outer frame is not illustrated in this cross section, because the outer frame is continuous with the signal-connecting leads 12. In this case, the lower part of the die pad 13 is shaped to have a stepped structure by performing half-etching with the center portion masked such that a convex portion 13a is formed in its center and a flange portion 13b exists around the convex portion 13a. The lead frame 20 prepared is not provided with tie bars used for stopping the outflow of a resin encapsulant during encapsulation.

The lead frame 20 of this embodiment is formed by plating a frame made of copper (Cu) with the three metal layers of: an undercoat nickel (Ni) layer; a palladium (Pd) layer deposited on the Ni layer; and an outermost thin gold (Au) layer. Alternatively, the lead frame 20 may be made of any raw material other than Cu, e.g., 42 alloy member. Also, the lead frame 20 may be plated with any noble metals other than Ni, Pd and Au. Furthermore, the lead frame 20 is not necessarily plated with three layers.

Figure 3:
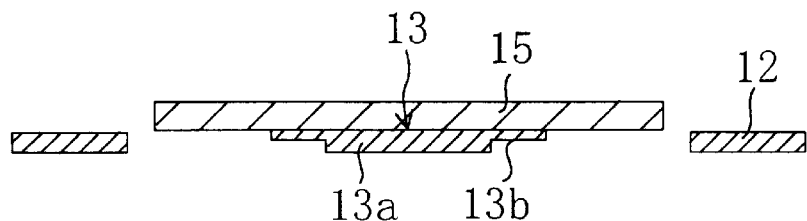
FIG. 3 is a cross-sectional view illustrating the step of bonding a semiconductor chip onto a die pad during the process of manufacturing the resin-molded semiconductor device of the first embodiment.

Next, in the process step shown in FIG. 3, a semiconductor chip 15 is mounted and bonded, with an adhesive, onto the die pad 13 of the lead frame 20 prepared. This process step is so-called "die bonding". It should be noted that any support member other than a lead frame may be used to support the semiconductor chip 15. For example, a TAB tape or a substrate may also be used.

Figure 4:
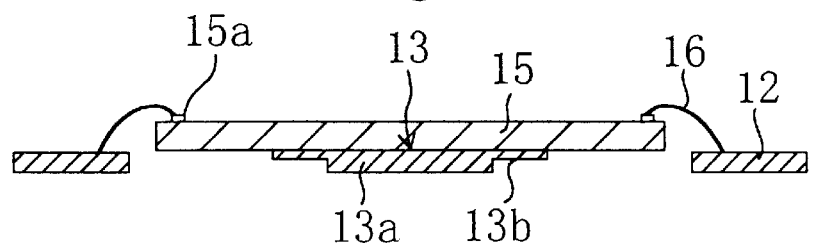
FIG. 4 is a cross-sectional view illustrating the step of bonding the chip to a lead frame with metal fine wires during the process of manufacturing the resin-molded semiconductor device of the first embodiment.

Then, in the process step shown in FIG. 4, the electrode pads 15a of the semiconductor chip 15, bonded to the die pad 13, are electrically connected to the signal-connecting leads 12 with metal fine wires 16. This process step is so-called "wire bonding". The metal fine wires 16 may be made of an appropriately selected material such as aluminum (Al) or Au. optionally, the electrode pads 15a of the semiconductor chip 15 may be electrically connected to the signal-connecting leads 12 via bumps or the like, instead of the metal fine wires 16.

Figure 5:
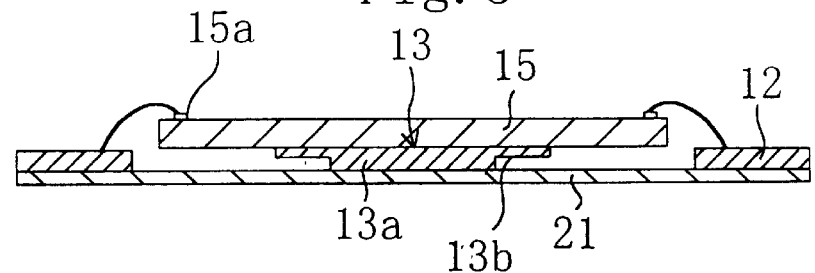
FIG. 5 is a cross-sectional view illustrating the step of placing a seal tape under the lead frame during the process of manufacturing the resin-molded semiconductor device of the first embodiment.

Subsequently, in the process step shown in FIG. 5, a seal tape 21 is attached to the respective lower surfaces of the convex portion 13a of the die pad 13 and the signal-connecting leads 12 with the semiconductor chip 15 bonded onto the die pad 13 of the lead frame.

The seal tape 21 is used as a mask for preventing the resin encapsulant from reaching the respective lower parts of the convex portion 13a of the die pad 13 and the signal-connecting leads 12 and forming resin burr thereon. The seal tape 21 may be any resin-based tape, which is mainly composed of polyethylene terephthalate, polyimide, polycarbonate or the like, can be easily peeled off after the encapsulation and has some resistance to an elevated-temperature environment during the encapsulation. In this embodiment, a tape mainly composed of polyethylene terephthalate is used and the thickness thereof is set at 50 $\mu$m.

Figure 6:
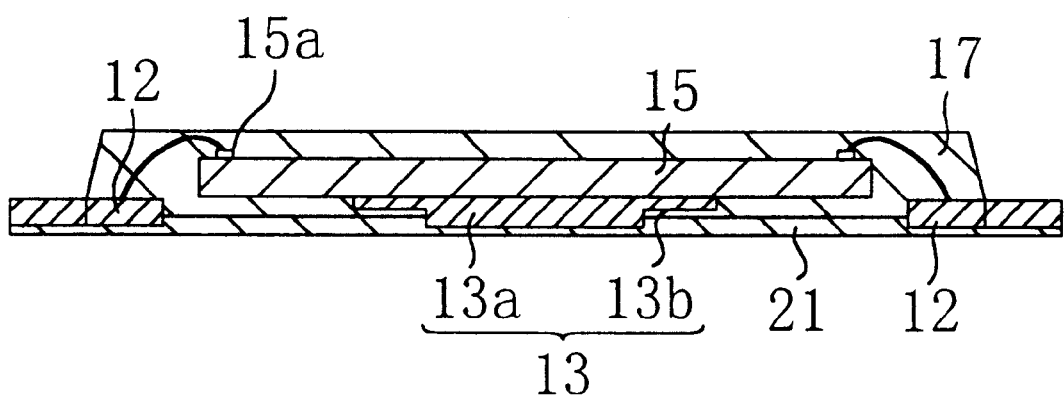
FIG. 6 is a cross-sectional view illustrating the step of encapsulating the chip and the lead frame with a resin encapsulant during the process of manufacturing the resin-molded semiconductor device of the first embodiment.

Then, in the process step shown in FIG. 6, the lead frame, in which the semiconductor chip 15 has been bonded and to which the seal tape 21 has been attached, is introduced into a die assembly. And a resin encapsulant 17 is poured into the die assembly to encapsulate the chip, frame and so on with the encapsulant 17. Alternatively, the seal tape 21 may be attached beforehand to the inner face of the die assembly. In such a case, the chip, frame and so on are encapsulated with the resin encapsulant 17 while pressing the outer periphery (outer frame) of the signal-connecting leads 12 of the lead frame with the die assembly such that the encapsulant 17 does not reach the respective lower surfaces of the convex portion 13a of the die pad 13 and the signal-connecting leads 12.

Finally, the seal tape 21, which has been attached to the respective lower surfaces of the convex portion 13a of the die pad 13 and the signal-connecting leads 12, is peeled off and removed. As a result, not the entire back surface of the die pad 13, but only the lower part of the convex portion 13a thereof protrudes downward from the back surface of the resin encapsulant 17. External electrodes 18 protruding from the back surface of the resin encapsulant 17 are formed and the outer periphery of the signal-connecting leads 12 is cut off to be substantially flush with the side faces of the resin encapsulant 17, thereby completing a resin-molded semiconductor device such as that shown in FIG. 1.

According to the method of this embodiment, a resin-molded semiconductor device, where only part of the convex portion 13a of the die pad 13 protrudes from the back surface of the resin encapsulant 17 existing under the flange portion 13b and around the convex portion 13a of the die pad 13, can be manufactured easily.

In addition, in accordance with the method of this embodiment, the seal tape 21 is attached to the respective lower surfaces of the convex portion 13a of the die pad 13 and the signal-connecting leads 12 before the step of encapsulating. Accordingly, the resin encapsulant 17 cannot reach, and no resin burr is formed on, the lower surfaces of the convex portion 13a of the die pad 13 and the signal-connecting leads 12 functioning as external electrodes. Thus, resin burr need not be removed from the respective lower surfaces of the convex portion 13a of the die pad 13 or the external electrodes 18 using water jet or the like, unlike a conventional method for manufacturing a resin-molded semiconductor device with the lower surfaces of signal-connecting leads entirely exposed. That is to say, since this troublesome step of deburring can be omitted, this process is simple enough to mass-produce a great number of resin-molded semiconductor devices. In addition, peeling of metal plated layers such as Ni, Pd and Au on the lead frame and deposition of impurities, which might happen during the conventional process step of deburring using water jet, can be eliminated. This is why the lead frame can be plated with these metal layers before the step of encapsulating.

Although the step of deburring using water jet can be omitted, the step of attaching the seal tape should be additionally performed in this embodiment. However, the step of attaching the seal tape 21 is more cost-effective than the water jet process step. And it is easier to control the former process step than the latter process step. Accordingly, the process can be simplified without fail. Among other things, the method of this embodiment is particularly advantageous in that attaching the seal tape 21 can eliminate the water jet process step, which has brought about various quality-control problems like peeling of plated layers from the lead frame and deposition of impurities. Thus, in this embodiment, the plated metal layers are much less likely to peel off. Also, it is true that resin burr still may be formed in this embodiment depending on the attachment state of the seal tape 21. Even so, the resulting resin burr is very thin, and can be easily removed with water jet at a low water pressure. Accordingly, should such a water jet process step be required, peeling of the metal plated layers can be prevented. And there is no problem if the lead frame is plated with these metal layers beforehand.

It should be noted that level differences are formed between the convex portion 13a of the die pad 13 and the back surface of the resin encapsulant 17 and between the respective back surfaces of the signal-connecting leads 12 and the resin encapsulant 17 as shown in FIG. 6. This is because the seal tape 21 softens and thermally shrinks owing to the heat applied during the encapsulation, and the convex portion 13a of the die pad 13 and the signal-connecting leads 12 are strongly forced into the seal tape 21. Accordingly, in this structure, the convex portion 13a of the die pad 13 and the signal-connecting leads 12 protrude from the back surface of the resin encapsulant 17. As a result, the standoff heights (or protrusion heights) of the convex portion 13a of the die pad 13 and the external electrodes 18, or the respective lower parts of the signal-connecting leads 12, can be secured. For example, in this embodiment, since the thickness of the seal tape 21 is 50 μm, the protrusion heights may be about 20 μm. As can be understood, by adjusting the thickness of the seal tape 21, the height of the protruding portion of each external electrode 18 measured from the back surface of the resin encapsulant can be maintained within an appropriate range. This means that the standoff height of each external electrode 18 can be controlled only by adjusting the thickness of the seal tape 21. That is to say, there is no need to separately provide means or step for controlling the standoff height, which is extremely advantageous to mass production in terms of the process control cost. The thickness of the seal tape 21 is preferably in the range from about 10 μm to about 150 μm.

It should be noted that the seal tape 21 may be made of any material having predetermined hardness, thickness and thermal softening properties suitable for a desired protrusion height.

In this embodiment, the standoff heights of the convex portion 13a of the die pad 13 and the external electrodes 18 may also be adjusted by regulating the pressure applied onto the seal tape 21. For example, the standoff heights may be set at approximately zero if necessary. In such a case, a thick layer of the resin encapsulant 17 exists under the flange portion 13b surrounding the convex portion 13a of the die pad 13 on its back surface. As a result, the resin encapsulant 17 can hold the die pad 13 even more strongly in such a case.

EMBODIMENT 2

Hereinafter, the second embodiment of the present invention will be described. The fundamental structure of the resin-molded semiconductor device of this embodiment is the same as that of the first embodiment shown in FIG. 1, except for the shape of the die pad. Thus, in this embodiment, only the shape of the die pad will be described, and the description of the other members will be omitted.

SPECIFIC EXAMPLE 1

Figure 7A:
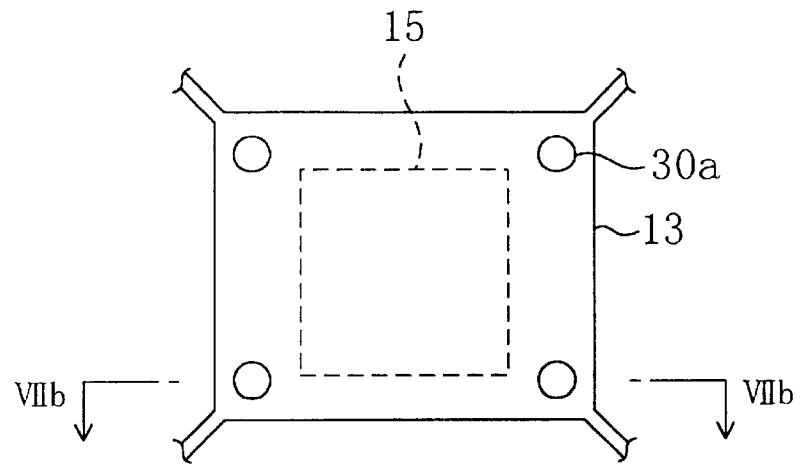
FIGS. 7(a) and 7(b) are respectively plan view and cross-sectional view of a lead frame according to a first specific example of the second embodiment of the present invention.
Figure 7B:
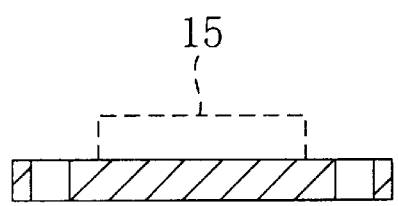

FIG. 7(a) is a plan view of a die pad 13 according to a first specific example of the second embodiment, while FIG. 7(b) is a cross-sectional view of the die pad 13 taken along the line VIIb—VIIb in FIG. 7(a). As shown in FIGS. 7(a) and 7(b), the die pad 13 of this specific example is provided with small, circular through holes 30a at the four corner portions thereof. These through holes 30a are formed outside of a region where the semiconductor chip 15 is mounted. In the illustrated example, no convex portion is formed on the back surface of the die pad 13. Optionally, a convex portion may be formed thereon.

In the resin-molded semiconductor device in the first specific example of the first embodiment, the through holes 30a are formed in the die pad 13. Accordingly, since these through holes 30a are filled in with the resin encapsulant, the force of the resin encapsulant 17 holding the die pad 13 and the adhesion between the die pad 13 and the resin encapsulant 17 considerably increase. As a result, penetration of water or moisture through the boundary between the die pad 13 and the resin encapsulant 17 can be prevented, thus improving the moisture resistance of the device.

In this example, the chip, frame and so on are encapsulated with a resin encapsulant during the process of manufacturing the resin-molded semiconductor device while a seal tape may be attached to the lower surface of the die pad 13 as in the first embodiment. In such a case, the resin encapsulant does not leak from the through holes 30a. In accordance with a conventional encapsulating method, if through holes are provided in a die pad exposed out of a resin encapsulant, then the resin encapsulant passes through the through holes to leak out of the back surface of the die pad. In addition, since no pressure is applied through a die assembly onto the die pad, a larger amount of resin encapsulant leaks out of the back surface of the die pad as compared with the back surface of the signal-connecting leads. As a result, the product value of such a device might be lost. Accordingly, apart from a device in which a die pad is buried in a resin encapsulant, such a structure as providing through holes for the die pad is hard to apply to a device of the type exposing the back surface of the die pad out of the resin encapsulant. In contrast, in this specific example, encapsulation is performed with the seal tape attached to the back surface of the die pad. Accordingly, the provision of the through holes 30a for the die pad 13 can increase the holding force of the resin encapsulant without causing such inconveniences such as resin leakage.

Figure 8:
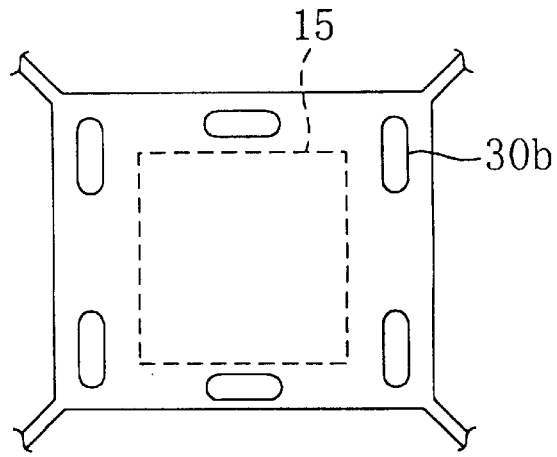
FIG. 8 is a plan view of a lead frame according to a variant of the first specific example of the second embodiment.

It should be noted that elliptical through holes 30b may be provided instead of circular ones as shown in FIG. 8 illustrating a modified example. In such a case, since the transversal cross-sectional area of each through hole 30b is larger than that of the circular one, the force of the resin encapsulant 17 holding the die pad 13 increases even more.

If necessary, the semiconductor chip 15 may be large enough to hang over the die pad 13.

Also, even when blind holes, not through holes, are formed, the holding force of the resin encapsulant 17 still can be increased.

SPECIFIC EXAMPLE 2

Figure 9A:
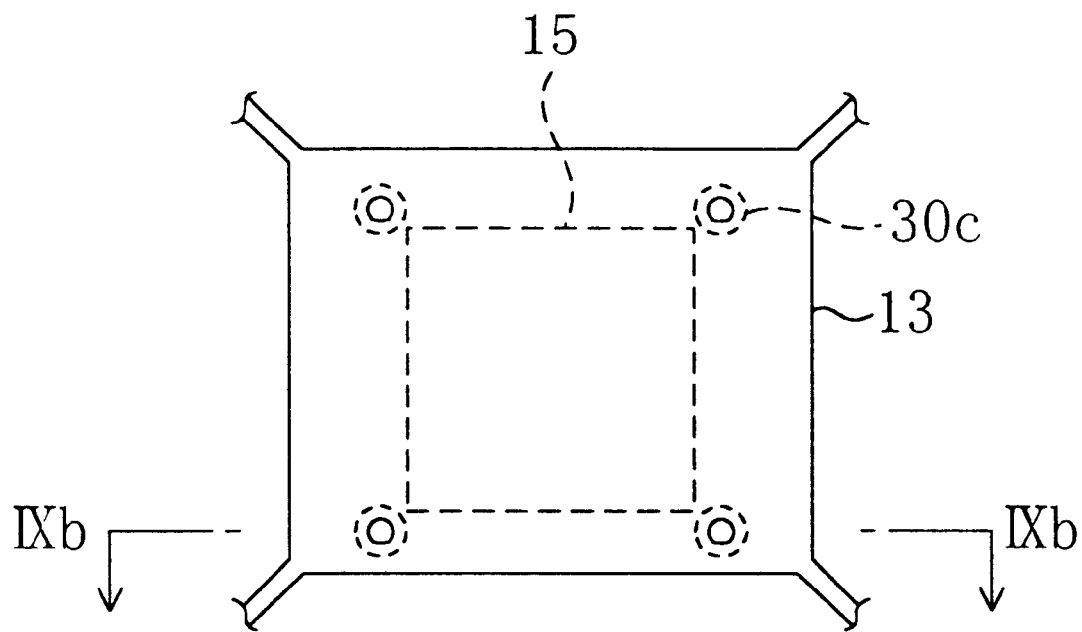
FIGS. 9(a) and 9(b) are respectively plan view and cross-sectional view of a lead frame according to a second specific example of the second embodiment.
Figure 9B:
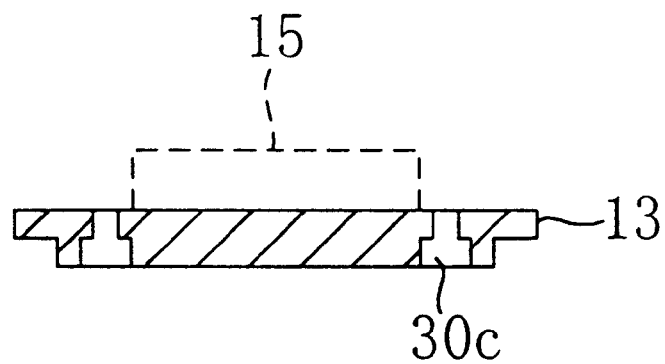

FIG. 9(a) is a plan view of a die pad 13 according to a second specific example of the second embodiment, while FIG. 9(b) is a cross-sectional view of the die pad 13 taken along the line IXb—IXb in FIG. 9(a). As shown in FIGS. 9(a) and 9(b), the die pad 13 of this specific example is provided with stepped through holes 30c at the four corner portions thereof. In each of these through holes 30c, the diameter of its lower part is larger than that of its upper part. These through holes 30c are formed outside of a region where the semiconductor chip 15 is mounted. Like the die pad 13 of the first embodiment, a convex portion is formed by half-etching or the like in the lower part of the die pad 13 of this example. However, in this example, the through holes 30c are formed in the convex portion.

In the resin-molded semiconductor device in the second specific example of the second embodiment, the stepped through holes 30c, each having a lower part larger in diameter, are provided for the die pad 13. Accordingly, the force of the resin encapsulant 17 holding the die pad 13 considerably increases.

Figure 10:
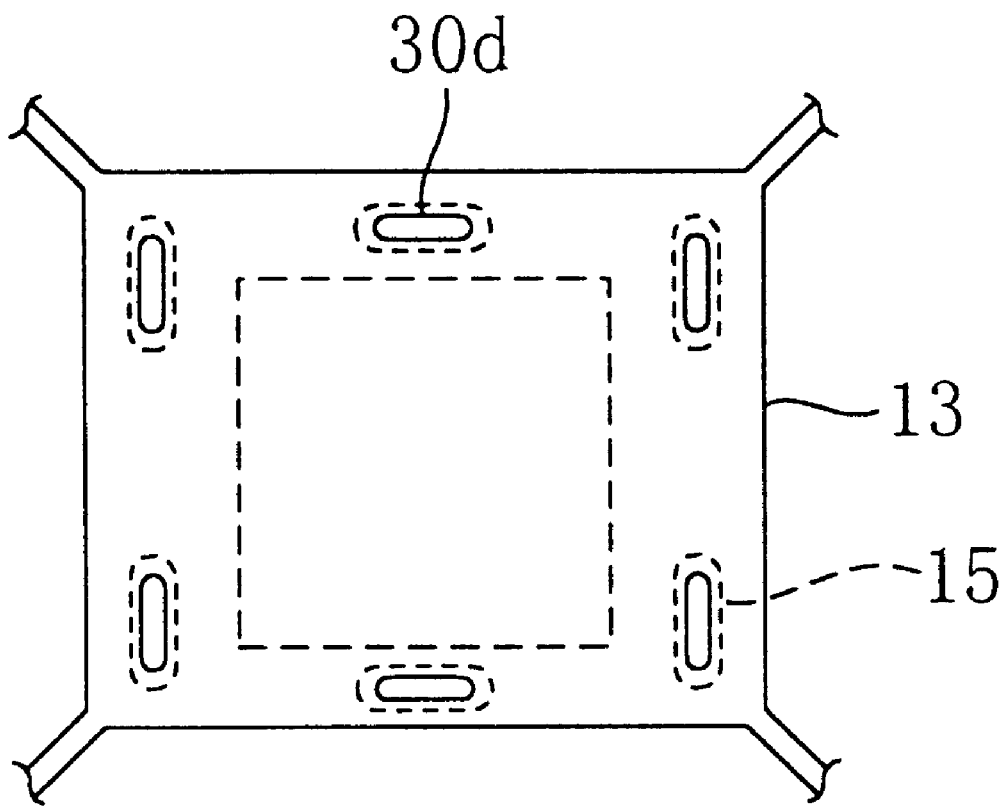
FIG. 10 is a plan view of a lead frame according to a variant of the second specific example of the second embodiment.

It should be noted that elliptical through holes 30d may be provided instead of circular ones as shown in FIG. 10 illustrating a modified example. In such a case, since the transversal cross-sectional area of each through hole 30d is larger than that of the circular one, the force of the resin encapsulant 17 holding the die pad 13 further increases. In particular, if elongate, elliptical through holes 30d are formed, then a larger area can be secured for the die pad 13 to be surrounded by these through holes 30d. Accordingly, the restriction on the size of a semiconductor chip to be mounted can be relaxed. In other words, the size of a resin-molded semiconductor device, applicable to a semiconductor chip of the same size, can be reduced.

The through holes 30c or 30d are not necessarily provided outside of the region where the semiconductor chip 15 is mounted. However, the holes 30c or 30d are preferably formed in a region that the resin encapsulant 17 can reach from the back surface of the die pad 13, i.e., a region surrounding the convex portion.

Also, if a semiconductor chip is flip-chip bonded to the die pad with bumps interposed therebetween, the resin encapsulant never fails to reach the inside of the through holes wherever these holes may be, so long as gaps are provided between the semiconductor chip and the die pad. Accordingly, there is no restriction on the locations of the through holes as a matter of principle.

Furthermore, the semiconductor chip 15 shown in FIGS. 9(a), 9(b) and 10 may be large enough to hang over the through holes 30c or 30d.

EMBODIMENT 3

Figure 11A:
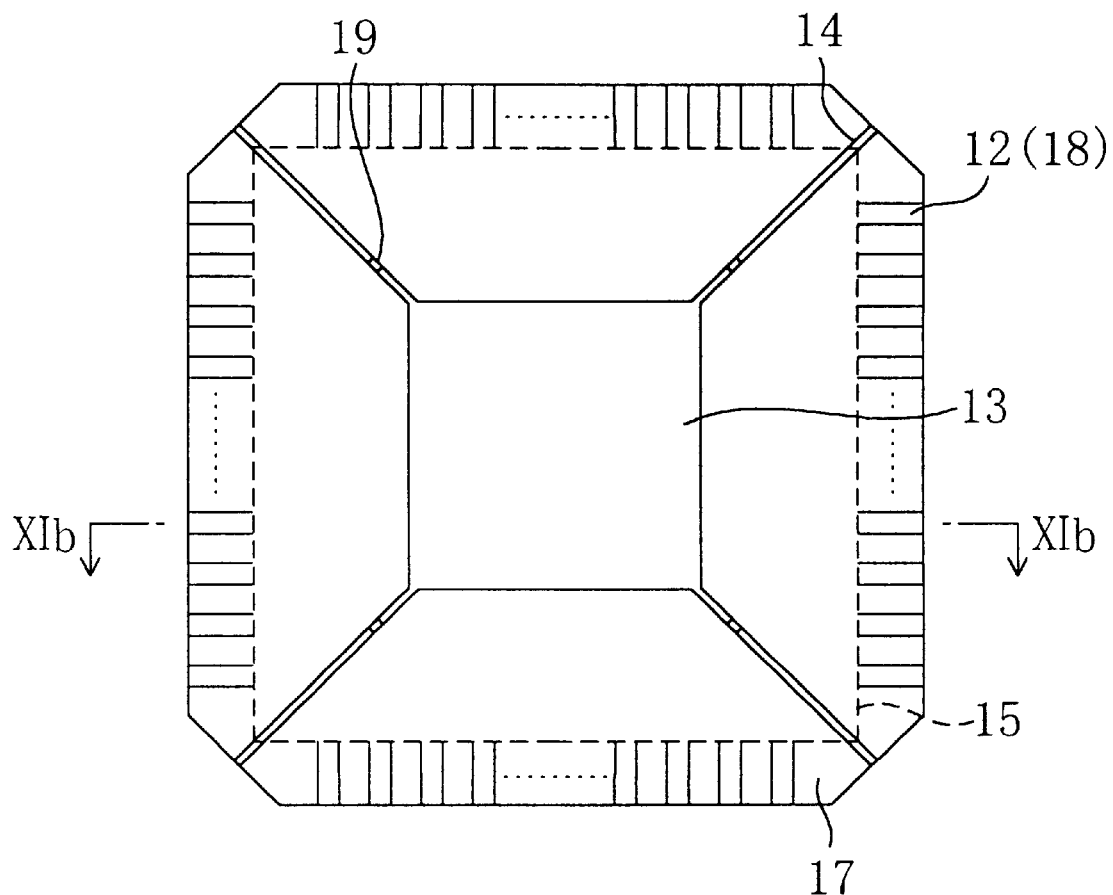
FIGS. 11(a) and 11(b) are respectively plan view and cross-sectional view of a resin-molded semiconductor device according to the third embodiment of the present invention.
Figure 11B:
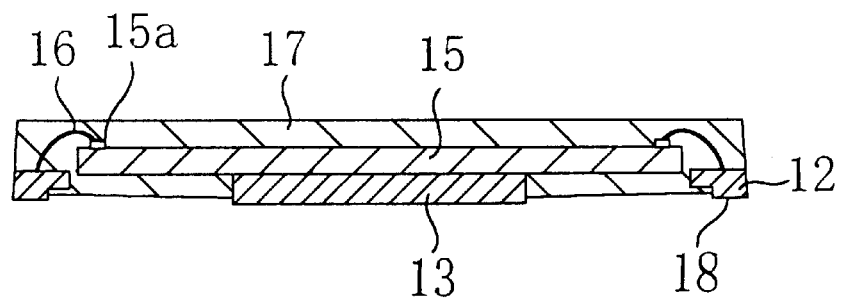

FIG. 11(a) is a plan view of a resin-molded semiconductor device according to the third embodiment, while FIG. 11(b) is a cross-sectional view of the device taken along the line XIb—XIb in FIG. 11(a). In FIG. 11(a), the resin encapsulant 17 thereof is illustrated as being transparent, the semiconductor chip 15 is supposed to have an outline indicated by the broken lines, and the metal fine wires 16 are not shown.

As shown in FIGS. 11(a) and 11(b), the resin-molded semiconductor device of this embodiment includes a lead frame consisting of: signal-connecting leads 12; a die pad 13 for supporting a semiconductor chip thereon; and support leads 14 for supporting the die pad 13. A semiconductor chip 15 is bonded onto the die pad 13 with an adhesive, and electrode pads 15a of the semiconductor chip 15 are electrically connected to the signal-connecting leads 12 with metal fine wires 16. And the signal-connecting leads 12, die pad 13, support leads 14, semiconductor chip 15 and metal fine wires 16 are encapsulated within a resin encapsulant 17. The inner peripheral region of each signal-connecting lead 12 on the lower part thereof is half-etched. Stated otherwise, the region of each signal-connecting lead 12 that is not half-etched constitutes a convex portion.

The feature of the resin-molded semiconductor device of this embodiment will be described. The die pad 13 is down-set by depressed portions 19 of the support leads 14 so as to be located below the signal-connecting leads 12. Also, no resin encapsulant 17 exists on the respective lower surfaces of the die pad 13 and the convex portion of each signal-connecting lead 12. That is to say, the back surface of the die pad 13 is exposed to be a heat-radiating face. The lower surface of the convex portion of each signal-connecting lead 12 is also exposed, and the lower part of the signal-connecting lead 12, including the lower surface of the convex portion thereof, functions as an external electrode 18. Virtually no resin burr, which ordinarily sticks out during the step of encapsulating, exists on the back surface of the die pad 13 and on the external electrodes 18. And the die pad 13 and the external electrodes 18 slightly protrude downward from the back surface of the resin encapsulant 17. Such a structure where the die pad 13 and the external electrodes 18 protrude downward and no resin burr exists can be easily formed by performing encapsulation with the seal tape attached to the respective lower surfaces of the die pad 13 and the signal-connecting leads 12 as described in the first embodiment.

In the resin-molded semiconductor device of this embodiment, the die pad 13 is down-set to be located below the signal-connecting leads 12 (or the external electrode 18). Accordingly, the effects to be described below can be attained.

Figure 12:
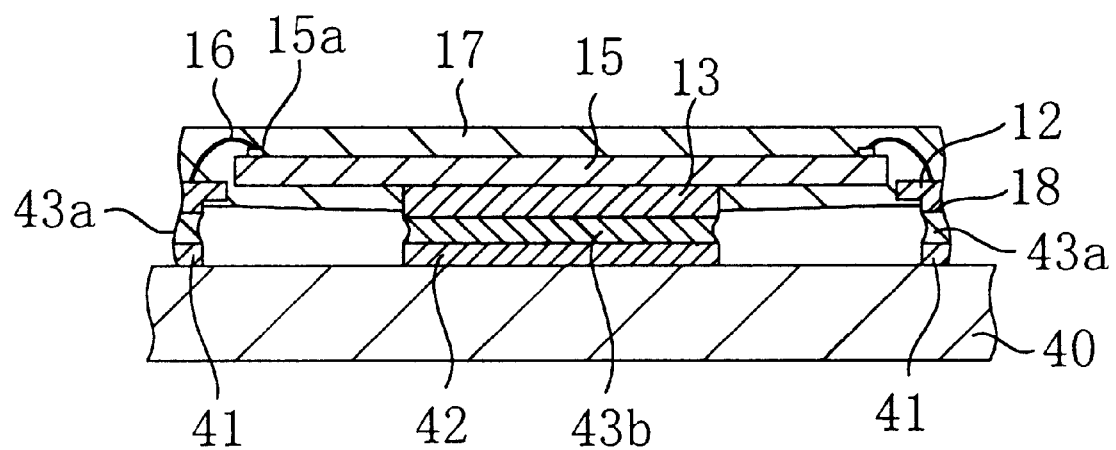
FIG. 12 is a cross-sectional view illustrating the resin-molded semiconductor device of the third embodiment mounted on a motherboard.

FIG. 12 is a cross-sectional view illustrating the resin-molded semiconductor device of the third embodiment mounted on a motherboard 40. As shown in FIG. 12, electrodes 41 and heat-radiating pad 42 on the motherboard 40 are aligned and soldered with the external electrodes 18 and die pad 13 of the resin-molded semiconductor device, respectively. In such a case, the thickness of solder 43a interposed between the external electrodes 18 and the electrodes 41 is different from that of solder 43b interposed between the die pad 13 and the heat-radiating pad 42. Accordingly, the tension applied between the external electrodes 18 and the electrodes 41 is different from that applied between the die pad 13 and the heat-radiating pad 42. As can be understood, since the tension of solder in the center of the resin-molded semiconductor device is different from that in the periphery thereof, the resin-molded semiconductor device can be self-aligned with a desired position on the motherboard 40 more accurately. Accordingly, the resin-molded semiconductor device can be mounted at a more accurate position in a shorter amount of time.

Also, since the die pad 13 having a larger area is strongly bonded onto the heat-radiating pad 42 of the motherboard 40 in the center region of the resin-molded semiconductor device, various stresses are applied to between the external electrodes 18 and the electrodes 41 after the bonding. Thus, the connection of the signal-connecting leads 12, which is often broken when the lower surface thereof is exposed, can be stabilized. Consequently, the reliability of the device can be improved as a whole.

In this embodiment, the lower surface of the die pad 13 is located below the lower surface of the external electrodes 18. However, the device can be self-aligned with satisfactory accuracy even if the level relationship between these surfaces is inverted. Nevertheless, if the lower surface of the die pad 13 is below that of the external electrodes 18, then the gap between the die pad 13 and the heat-radiating pad 42 is smaller and the tension increases in that broad region. Therefore, the above effects can be attained more remarkably.

EMBODIMENT 4

Hereinafter, the fourth embodiment of the present invention will be described. In the fourth embodiment, it will be described specifically how deformation of the die pad 13 can be suppressed during the step of encapsulating in which a seal tape is placed under the lead frame as in the first embodiment.

SPECIFIC EXAMPLE 1

Figure 13A:
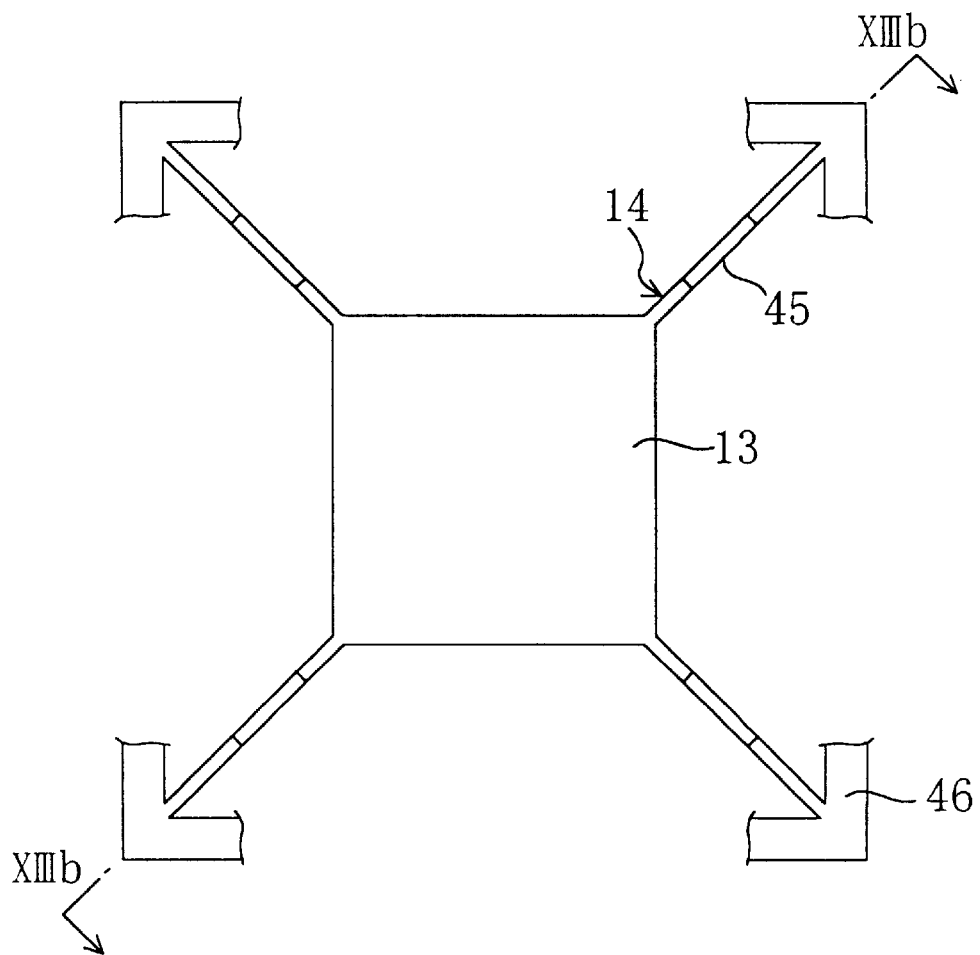
FIGS. 13(a) and 13(b) are respectively plan view and cross-sectional view of a lead frame according to a first specific example of the fourth embodiment of the present invention.
Figure 13B:
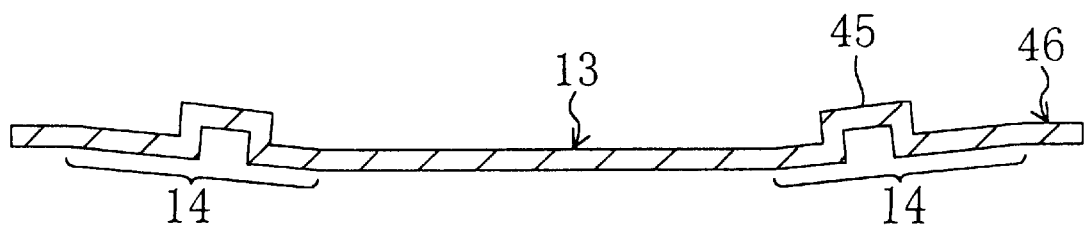

FIG. 13(a) is a plan view of a lead frame according to a first specific example of the fourth embodiment, while FIG. 13(b) is a cross-sectional view of the lead frame taken along the line XIIIb—XIIIb in FIG. 13(a). As shown in FIGS. 13(a) and 13(b), support leads 14 are provided to extend from the four corner portions of the die pad 13 and be connected to an outer frame 46. Each of these support leads 14 is provided with a U-shaped bent portion 45 functioning as a spring. The lower surface of the die pad 13 is lower than that of the outer frame 46. In other words, a predetermined level difference exists between these members.

If the lower surface of the die pad 13 is located below that of the outer frame 46 this way, pressure can also be applied from the die pad 13 onto a seal tape that is attached to the lower surface of the lead frame during the step of encapsulating. Specifically, in general, a die cavity exists over the die pad 13. Accordingly, clamping force applied between the upper and lower dies of a die assembly cannot be satisfactorily transmitted to the die pad 13 in such a case. Thus, the effect of the first embodiment, that is, protruding the lower part of the die pad 13 on the back surface of the seal tape by forcing the die pad 13 into the seal tape, might be weakened. In contrast, in this specific example, the lower surface of the die pad 13 is located below that of the outer frame 46. Thus, when clamping force is applied through the die assembly to the outer frame 46, pressure is applied through the support leads 14 to the die pad 13, which is forced in turn into the seal tape. As a result, the die pad 13 can protrude sufficiently from the resin encapsulant 17. Also, by providing the bent portions 45 for the support leads 14 of the lead frame, each support lead 14 is deformed at its bent portion 45, thus suppressing the deformation of the die pad 13.

In the configuration shown in FIG. 13(b), the die pad 13 is located lower than the U-shaped bent portions 45, because the entire lead frame is inclined. Alternatively, the die pad 13 may be lowered by providing level differences on both sides of each U-shaped bent portion 45.

SPECIFIC EXAMPLE 2

Figure 14A:
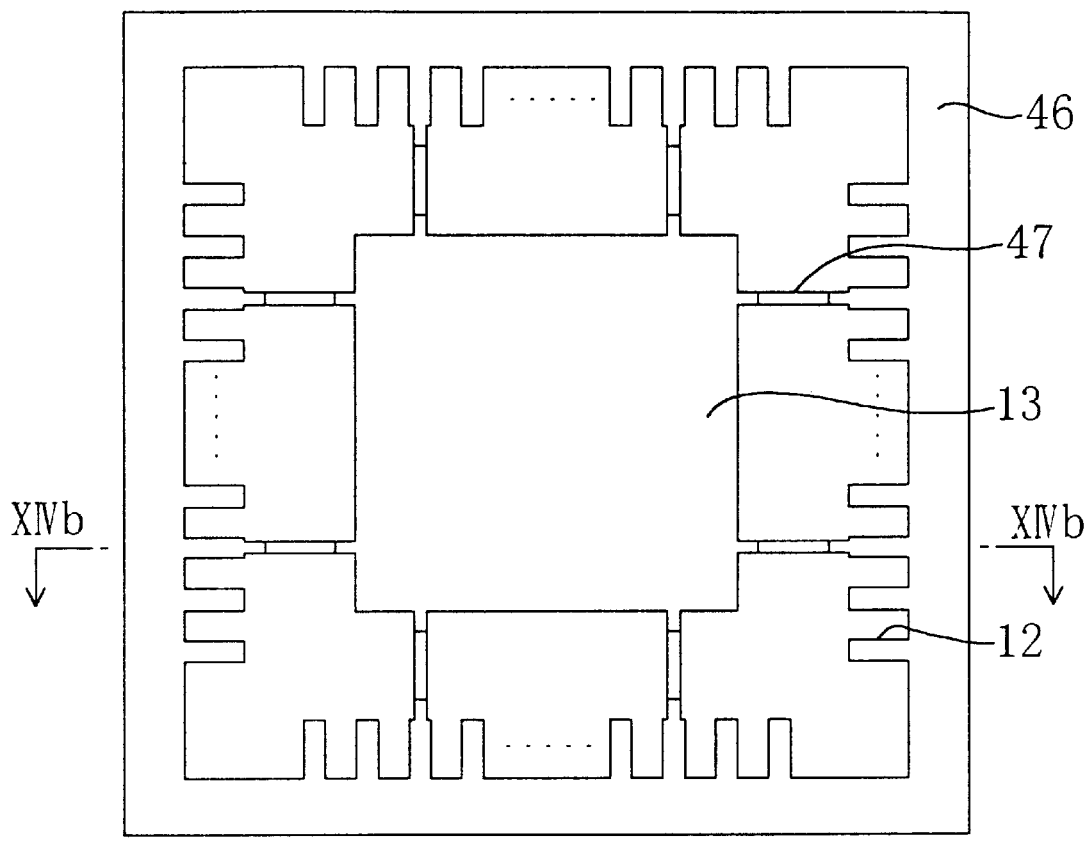
FIGS. 14(a) and 14(b) are respectively plan view and cross-sectional view of a lead frame according to a second specific example of the fourth embodiment.
Figure 14B:
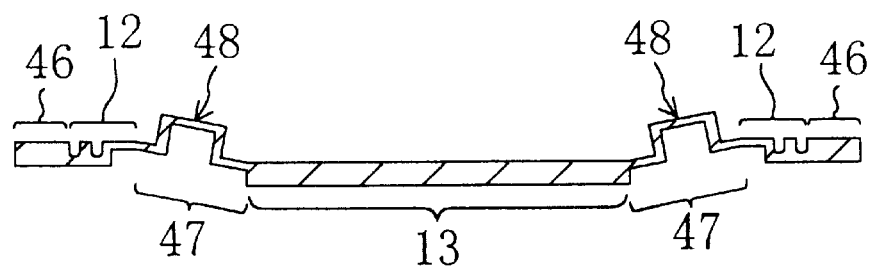

FIG. 14(a) is a plan view of a lead frame according to a second specific example of the fourth embodiment, while FIG. 14(b) is a cross-sectional view of the lead frame taken along the line XIVb—XIVb in FIG. 14(a).

As shown in FIGS. 14(a) and 14(b), in the lead frame of this specific example, support leads 47 are interposed between the die pad 13 and the signal-connecting leads 12 connected to the outer frame 46. In other words, the lead frame is configured to make the outer frame 46 support the die pad 13 via the support leads 47 and the signal-connecting leads 12. Each of these support leads 47 is provided with a U-shaped bent portion 48 to function as a spring. In this example, part of the back surface of each signal-connecting lead 12 is half-etched, while the remaining part, not half-etched, constitutes a convex portion. On the upper surface of each signal-connecting lead 12, two grooves are formed to extend vertically to the direction in which the signal-connecting lead 12 extends.

Figure 15A:
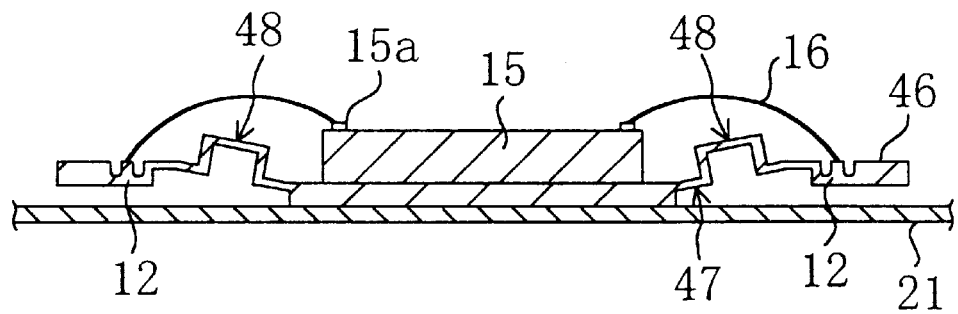
FIGS. 15(a) and 15(b) are cross-sectional views illustrating parts of the process for manufacturing a resin-molded semiconductor device using the lead frame according to the second specific example of the fourth embodiment.
Figure 15B:
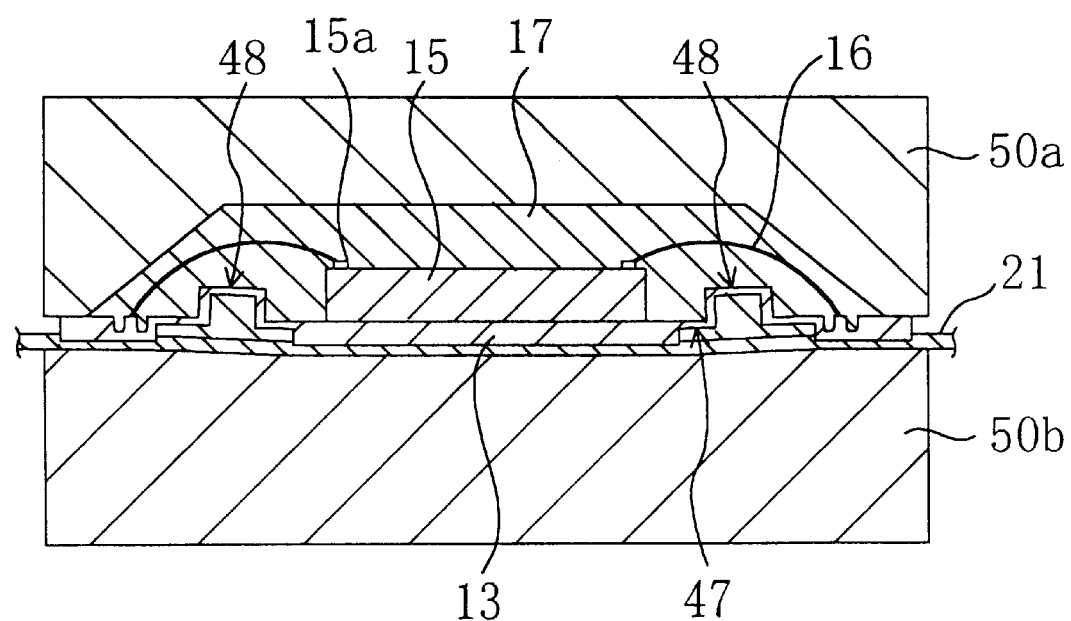

FIGS. 15(a) and 15(b) are cross-sectional views illustrating part of the process for manufacturing a resin-molded semiconductor device using this lead frame.

First, as shown in FIG. 15(a), a semiconductor chip 15 is mounted to the die pad 13, and the electrode pads 15a of the semiconductor chip 15 are connected to the signal-connecting leads 12 with metal fine wires 16 at the part thereof interposed between the two grooves. And a seal tape 21 is attached to the die pad 13 of the lead frame.

Next, as shown in FIG. 15(b), the lead frame and the semiconductor chip 15 are introduced into a cavity between upper and lower dies 50a, 50b of a die assembly 50. Then, clamping force is applied to the outer frame 46 of the lead frame between the upper and lower dies 50a, 50b. And when the outer frame 46 is pressed by the clamping force, the pressure is transmitted to the die pad 13, located below the outer frame 46, via the signal-connecting leads 12 and the support leads 47. Accordingly, the die pad 13, the convex portion of the signal-connecting leads 12 and the outer frame 46 are all forced into the seal tape 21. By pouring the resin encapsulant 17 into the die cavity of the die assembly 50 in such a state, the die pad 13, the signal-connecting leads 12 and so on are encapsulated with the resin encapsulant 17.

In this specific example, the portion of the lower die 50b corresponding to the die pad 13 is slightly lower than the portion thereof corresponding to the outer frame 46 (and the signal-connecting leads 12). Thus, although the level difference between the die pad 13 and the outer frame 46 (and the signal-connecting leads 12) decreases to a large degree after the encapsulation, the lower surface of the die pad 13 is still located lower than the outer frame 46.

Then, after the step of encapsulating is finished, the seal tape 21 is peeled off from the encapsulated members and the connection between the outer frame 46 and the signal-connecting leads 12 is cut off, thereby removing the outer frame 46. As a result, a resin-molded semiconductor device, in which the die pad 13 and the convex portion (external electrode) of the signal-connecting leads 12 are exposed out of the resin encapsulant, can be obtained.

In this specific example, the support leads 47 are provided between the signal-connecting leads 12 and the sides of the die pad 13. Accordingly, the clamping force applied to the outer frame 46 can be transmitted more effectively to the die pad 13 than the first specific example. Thus, a structure, in which the lower surface of the die pad 13 is exposed out of the back surface of the resin encapsulant, can be formed with more certainty.

Also, in the resin-molded semiconductor device completed, the lower surface of the die pad 13 is located below the respective lower surfaces of the signal-connecting leads 12. Accordingly, the self-alignment is realized with good accuracy as described above.

SPECIFIC EXAMPLE 3

If the support leads 47 are provided between the signal-connecting leads 12 and the sides of the die pad 13 as in the second specific example, the use of the signal-connecting leads 12, connected to the support leads 47, for signal transmission sometimes causes inconveniences depending on the type of a component formed in the semiconductor chip 15 (e.g., a bipolar transistor). Thus, in this specific example, means for avoiding such inconveniences will be described.

Figure 16:
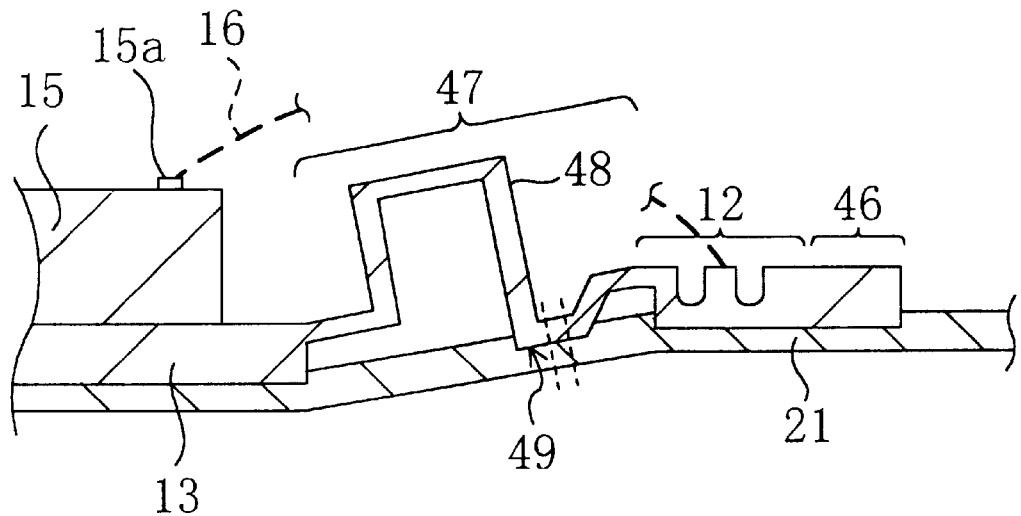
FIG. 16 is a cross-sectional view illustrating part of a lead frame in the step of encapsulating during the manufacturing process of a resin-molded semiconductor device according to a third specific example of the fourth embodiment.

FIG. 16 is a cross-sectional view illustrating part of a lead frame during the step of encapsulating to manufacture a resin-molded semiconductor device in this specific example. In this specific example, part of the support leads 47 is exposed out of the resin encapsulant. That is to say, the lead frame is configured in such a shape that a rising portion 49 of each bent portion 48 of a support lead 47 is forced into the seal tape 21 within a die assembly. And after the step of encapsulating is finished, the rising portion 49 is cut off with laser light or the like as indicated by the broken lines in FIG. 16. By cutting off part of the support lead 47 this way, the signal-connecting lead 12 connected to the support lead 47 is electrically disconnected from the die pad 13. Accordingly, even when the signal-connecting lead 12 is used for signal transmission, there is no problem. On the other hand, since these members have already been encapsulated with the resin encapsulant, the support leads 47 have already played their roles. Thus, such cutting causes no problems, either. Also, if the support leads 47 are left as they are to retain some elasticity after the encapsulation, the reliability of the device might deteriorate, because residual stress exists in the resin encapsulant. However, in this example, such inconvenience can be avoided.

It should be noted that after the step of encapsulating, the rising portion 49 of each support lead 47 may be cut off together with the seal tape 21, while the tape 21 is still attached to the lead frame. In such a case, the region surrounding the cut portion is covered with the seal tape 21. Accordingly, even if some part molten by the laser light is scattered around, the scattered part can be advantageously removed easily from the resin-molded semiconductor device by peeling off the seal tape 21.

SPECIFIC EXAMPLE 4

If part of each support lead 47 is cut as in the third specific example, it might take a lot of trouble to cut the part well. Thus, in this specific example, means for facilitating cutting of the support leads will be described.

Figure 17:
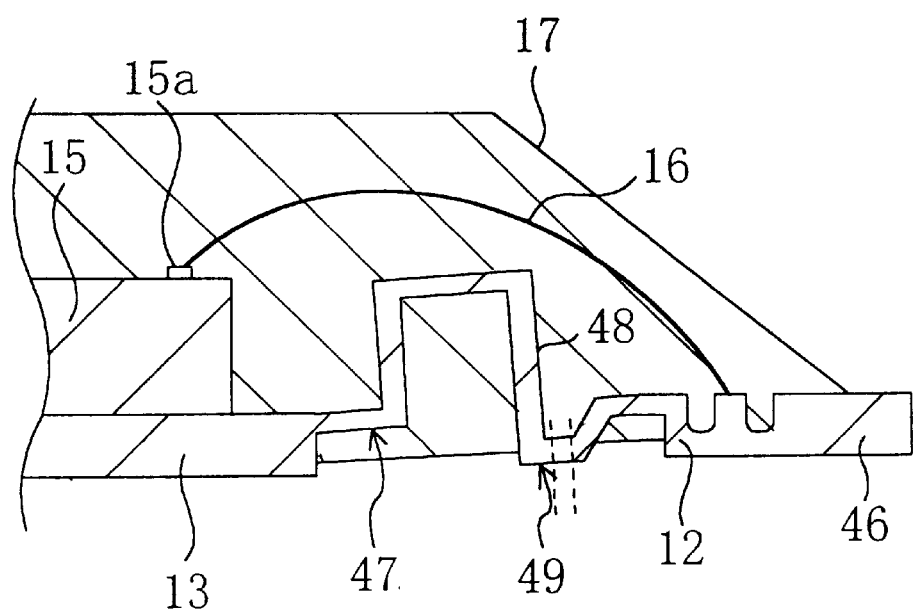
FIG. 17 is a cross-sectional view illustrating part of a lead frame in the step of encapsulating during the manufacturing process of a resin-molded semiconductor device according to a fourth specific example of the fourth embodiment.

FIG. 17 is a cross-sectional view illustrating part of a lead frame according to a fourth specific example of the fourth embodiment. As shown in FIG. 17, the surface of a rising portion 49 of a support lead 47 of this specific example is provided with a notch.

In this specific example, since the surface of the rising portion 49 of the support lead 47 is provided with a notch, the work of cutting the rising portion 49 with laser light or the like after the step of encapsulating can be performed easily and rapidly.

As described in the foregoing specific examples of the fourth embodiment, in a resin-molded semiconductor device formed by the process according to any of these examples, the die pad 13 and signal-connecting leads 12 are partially exposed out of the resin encapsulant as in the device shown in FIG. 1. In particular, since a level difference is provided between the outer frame and the die pad in these specific examples, clamping force, applied to the outer frame, can be transmitted through the support leads to the die pad, which can be forced into the seal tape with more certainty. As a result, a structure in which the lower part of the die pad is exposed out of the resin encapsulant can be formed easily.

Also, even when the lower surface of the die pad should be located below that of the signal-connecting leads as in the third embodiment, remarkable effects can be attained by employing the support lead structure according to this embodiment as shown in respective drawings of this embodiment.

In this embodiment, a structure like that shown in FIG. 1, in which a convex portion is formed in the lower part of the die pad 13 and protrudes by itself from the resin encapsulant, can also be employed. Such a structure is preferred in that the resin encapsulant 17 can hold the die pad 13 more strongly in such a case.

EMBODIMENT 5

In this embodiment, it will be described how encapsulation should be performed to adjust the protrusion height of the die pad from the resin encapsulant.

Figure 18:
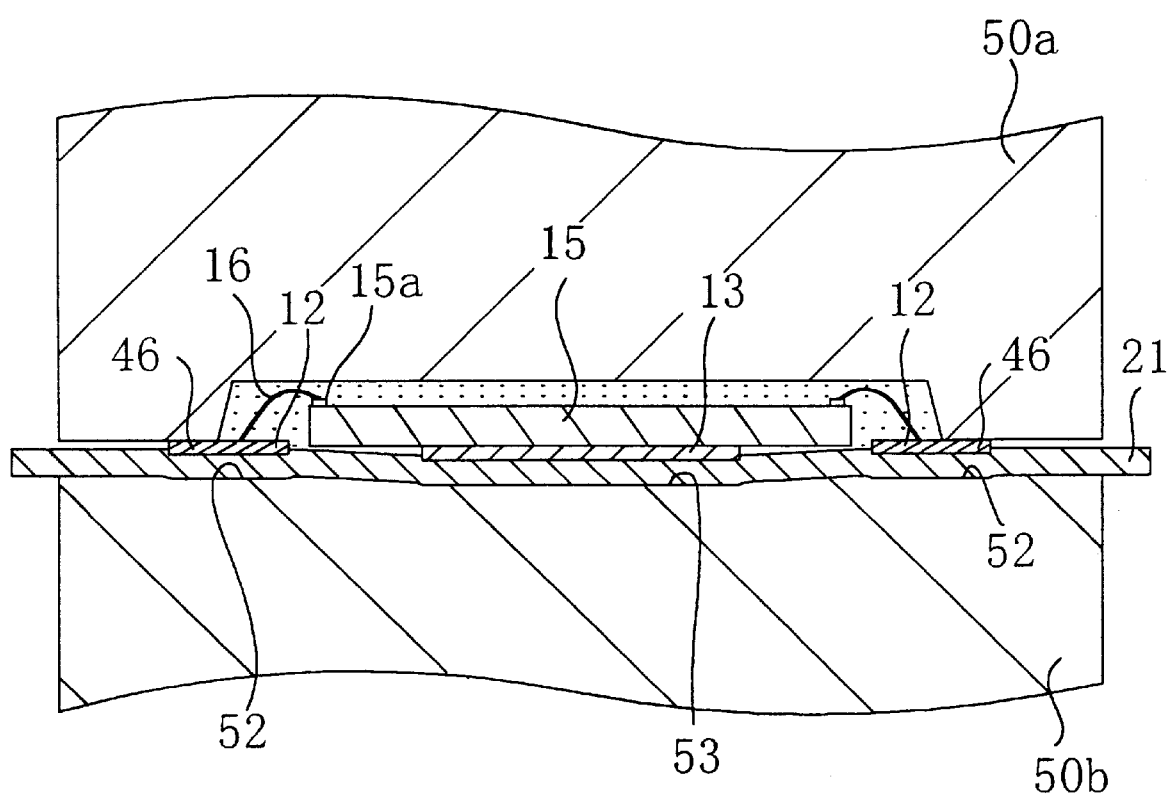
FIG. 18 is a cross-sectional view illustrating the step of encapsulating during the manufacturing process of a resin-molded semiconductor device according to the fifth embodiment of the present invention.

FIG. 18 is a cross-sectional view illustrating the step of encapsulating to manufacture a resin-molded semiconductor device according to this embodiment. As shown in FIG. 18, a die assembly consisting of upper and lower dies 50a, 50b is used. A semiconductor chip 15 is mounted onto a die pad 13. The electrode pads 15a of the semiconductor chip 15 are connected to signal-connecting leads 12 with metal fine wires 16. And the chip, frame and so on are placed onto the lower die 50b of the die assembly and encapsulated with the seal tape 21 attached to the lower surface of the lead frame.

The method of this embodiment is characterized in that the lower die 50b is provided with first and second concave clearance portions 52 and 53. The first clearance portions 52 are formed to face the signal-connecting leads 12 (and the outer frame 46) of the lead frame, while the second clearance portion 53 is formed to face the die pad 13.

If such clearance portions 52 and 53 are provided for the die assembly to make the seal tape 21 enter these portions 52 and 53, then the signal-connecting leads 12 and the die pad 13 are not forced into the seal tape 21 so much. As a result, the heights of the portions to be protruded can be adjusted at desired values based on not only the clamping force applied to the die assembly but also the depths of the clearance portions 52, 53. Accordingly, the formation of resin burr can also be minimized.

EMBODIMENT 6

In this embodiment, it will be described how encapsulation should be performed to protrude the die pad from the resin encapsulant much higher.

Figure 19:
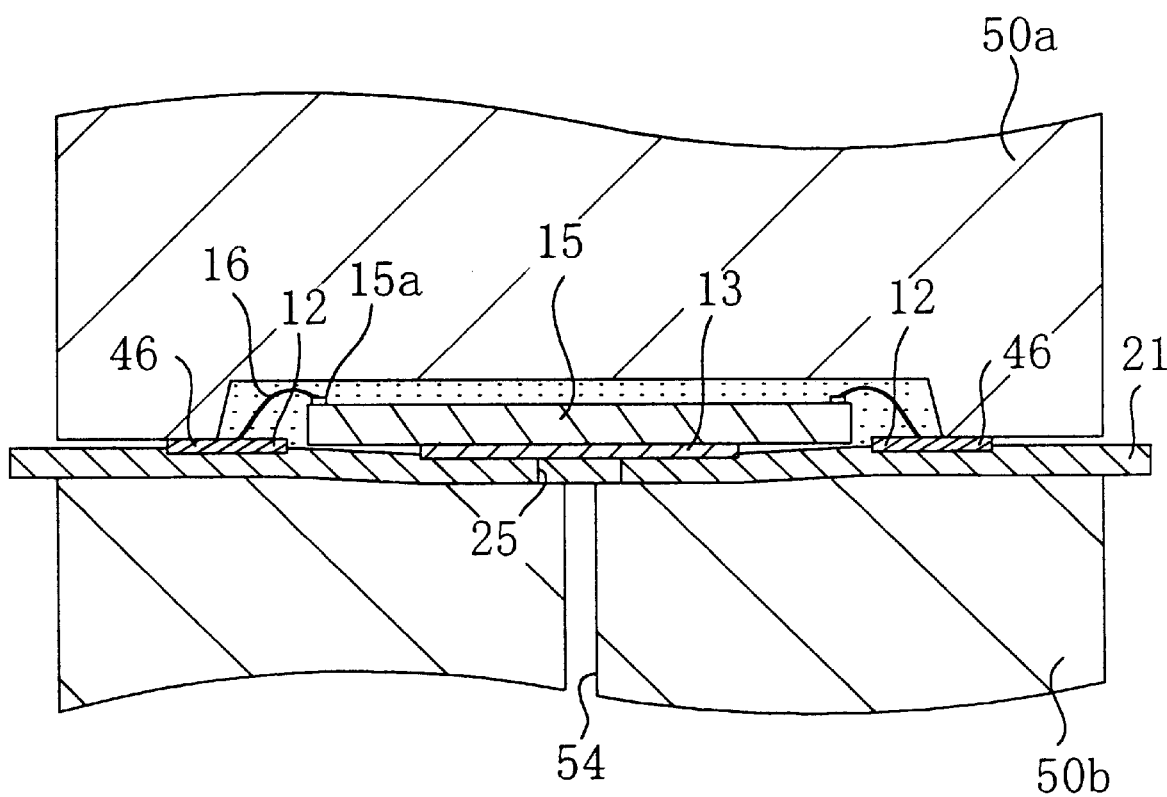
FIG. 19 is a cross-sectional view illustrating the step of encapsulating during the manufacturing process of a resin-molded semiconductor device according to the sixth embodiment of the present invention.
Figure 20:
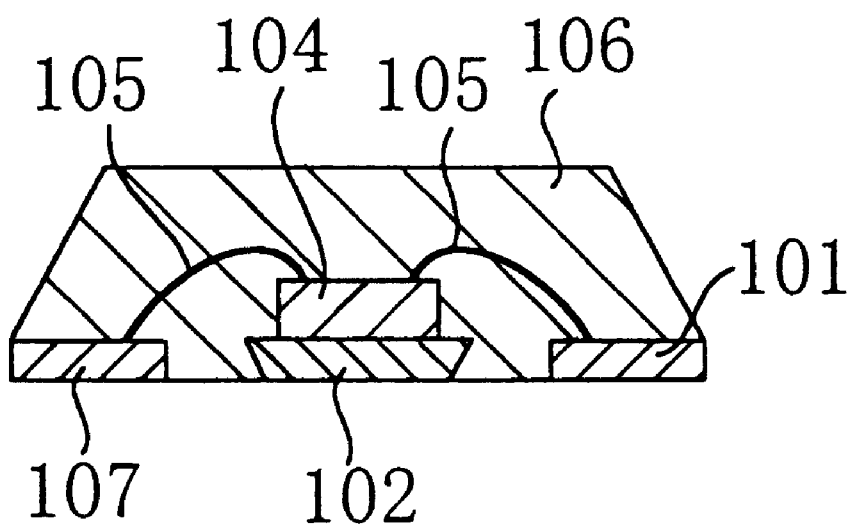
FIG. 20 is a cross-sectional view of a conventional resin-molded semiconductor device of the type including external electrodes on its back surface.

FIG. 19 is a cross-sectional view illustrating the step of encapsulating to manufacture a resin-molded semiconductor device according to this embodiment. As shown in FIG. 19, a die assembly consisting of upper and lower dies 50a, 50b is used. A semiconductor chip 15 is mounted onto a die pad 13. The electrode pads 15a of the semiconductor chip 15 are connected to signal-connecting leads 12 with metal fine wires 16. And the chip, frame and so on are placed onto the lower die 50b of the die assembly and encapsulated with a resin encapsulant with the seal tape 21 attached to the lower surface of the lead frame.

The method of this embodiment is characterized in that the seal tape 21 is provided with a through hole 25 located under the die pad 51 and that the lower die 50b is provided with a suction hole 54 in a region facing the die pad 13. The through hole 25 of the seal tape 21 is larger in diameter than the suction hole 54 of the lower die 50b, thus facilitating the positioning control of the through hole 54 to be aligned with the suction hole 25. The suction hole 54 communicates with a vacuum pump, which absorbs the die pad 13 toward the suction hole 54, thereby forcing the die pad 13 into the seal tape 21 more strongly.

In accordance with the method of this embodiment for manufacturing a resin-molded semiconductor device, by providing the through hole 25 and the suction hole 54 for the seal tape 21 and the die assembly, respectively, the die pad 13 can be forced into the seal tape 21 more strongly. Accordingly, even a die pad 13 having a large area, to which the clamping force is hard to be satisfactorily transmitted through the die assembly, can be protruded from the resin encapsulant much higher.

The method of this embodiment is naturally applicable to any member to be protruded from the resin encapsulant other than the die pad.

OTHER EMBODIMENTS

In the foregoing embodiments, the electrode pads of the semiconductor chip and the signal-connecting leads are connected to each other with metal fine wires. However, the connection members of the present invention are not limited to the metal fine wires. For example, if necessary, a resin-molded semiconductor device may be formed by encapsulating a semiconductor chip, which has been flip-chip mounted on a substrate via bumps interposed therebetween, with a resin encapsulant.

Also, if a suction hole is provided for a die assembly to encapsulate the chip, lead frame and so on while absorbing the seal tape 21 with the vacuum pressure, formation of wrinkles on the seal tape can be suppressed and the back surface of the resin encapsulant can be flattened.

What is claimed is:

1. A lead frame comprising:

an outer frame surrounding a region in which a semiconductor chip is mounted;

a die pad formed in the region surrounded by the outer frame;

support leads for supporting the die pad by connecting the die pad to the outer frame; and signal-connecting leads connected to the outer frame, wherein the die pad is located below the outer frame, and part of each said support lead is bent to function as a spring.

2. A lead frame comprising:

an outer frame surrounding a region in which a semiconductor chip is mounted;

a die pad formed in the region surrounded by the outer frame;

support leads for supporting the die pad by connecting the die pad to the outer frame; and signal-connecting leads connected to the outer frame, wherein the die pad is located below the outer frame, the support leads are provided between the signal-connecting leads and the die pad, and part of each said support lead is bent to function as a spring.

3. The lead frame of claim 2, wherein the thickness of the bent part of each said support lead is reduced at the bottom thereof.

4. A resin-molded semiconductor device comprising:

a semiconductor chip having electrode pads;

a die pad for supporting the semiconductor chip thereon;

support leads for supporting the die pad;

signal-connecting leads;

connecting members for electrically connecting the electrode pads of the semiconductor chip to the signal-connecting leads; and a resin encapsulant for encapsulating the die pad, the semiconductor chip, the signal-connecting leads and the connecting members, wherein respective lower parts of the die pad and the signal-connecting leads are at least partially not covered with the resin encapsulant but exposed, and wherein each said support lead extends from an associated corner of the die pad to reach a side face of the resin encapsulant and is partially bent to function as a spring.

5. The device of claim 4, wherein the lower surface of the exposed part of the die pad is located at a level lower than the lower surface of the exposed part of each said signal-connecting lead.

6. A resin-molded semiconductor device comprising:

a semiconductor chip having electrode pads;

a die pad for supporting the semiconductor chip thereon;

support leads for supporting the die pad;

signal-connecting leads;

connecting members for electrically connecting the electrode pads of the semiconductor chip to the signal-connecting leads; and a resin encapsulant for encapsulating the die pad, the semiconductor chip, the signal-connecting leads and the connecting members, wherein respective lower parts of the die pad and the signal-connecting leads are at least partially not covered with the resin encapsulant but exposed, the support leads are provided between the die pad and the signal-connecting leads, and each said support lead is partially bent to function as a spring.

7. The device of claim 6, wherein each said support lead is partially cut off.

8. The device of claim 7, wherein a portion surrounding the cut part of each said support lead is thinner than the other parts of the support lead.

* * * * *